(12) United States Patent
Kuwano (10) Patent No.: US 9,310,448 B2
(45) Date of Patent: Apr. 12, 2016

(54) DETECTION CIRCUIT, SEMICONDUCTOR INTEGRATED CIRCUIT DEVICE, MAGNETIC FIELD ROTATION ANGLE DETECTION DEVICE, AND ELECTRONIC DEVICE

(71) Applicant: SEIKO EPSON CORPORATION, Tokyo (JP)

(72) Inventor: Toshikazu Kuwano, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 143 days.

(21) Appl. No.: 14/175,565

(22) Filed: Feb. 7, 2014

(65) Prior Publication Data

US 2014/0285188 A1 Sep. 25, 2014

(30) Foreign Application Priority Data

Mar. 22, 2013 (JP) .................. 2013-059601

(51) Int. Cl.
*G01B 7/30* (2006.01)
*G01R 33/09* (2006.01)
*G01R 33/02* (2006.01)
*G01R 33/00* (2006.01)
*G01D 5/14* (2006.01)

(52) U.S. Cl.
CPC .............. *G01R 33/09* (2013.01); *G01D 5/145* (2013.01); *G01R 33/0023* (2013.01); *G01R 33/02* (2013.01); *G01R 33/093* (2013.01)

(58) Field of Classification Search
CPC ........ G01D 5/145; G01R 33/09; G01R 33/02; G01R 33/093

USPC ................. 324/207.25, 207.21, 252
See application file for complete search history.

(56) References Cited

U.S. PATENT DOCUMENTS

| | | | |
|---|---|---|---|
| 8,378,664 B2 * | 2/2013 | Hinz | 324/207.13 |
| 2006/0136169 A1 | 6/2006 | Shonai et al. | |
| 2009/0033321 A1 | 2/2009 | Kurihara | |
| 2011/0115477 A1 * | 5/2011 | Suzuki | 324/207.21 |
| 2012/0242170 A1 | 9/2012 | Kuwano et al. | |

FOREIGN PATENT DOCUMENTS

| | | |
|---|---|---|
| JP | A-3-137583 | 6/1991 |
| JP | A-8-248056 | 9/1996 |
| JP | A-2006-194861 | 7/2006 |
| JP | A-2007-24738 | 2/2007 |

(Continued)

*Primary Examiner* — Reena Aurora
(74) *Attorney, Agent, or Firm* — Oliff PLC (57) ABSTRACT

Detection of the rotation angle of a magnetic field using a magnetic sensor in which two sensor units are arranged at a predetermined angle with respect to each other is performed with a resolution of an angle smaller than 45° with a simple circuit configuration. A detection circuit is connectable to a magnetic sensor in which first and second sensor units are arranged at a predetermined angle with respect to each other, each sensor unit having a bridge circuit of magnetoresistance elements. The detection circuit includes a first comparison circuit that compares output signals of the first or second sensor unit, a second comparison circuit that compares an output signal of the first sensor unit with an output signal of second sensor unit, and a rotation angle calculation circuit that calculates a rotation angle of a magnetic field based on the comparison results of the first and second comparison circuits.

15 Claims, 7 Drawing Sheets

(56) References Cited

FOREIGN PATENT DOCUMENTS

| JP | A-2009-198316 | 9/2009 |
| JP | A-2011-95047 | 5/2011 |
| JP | A-2012-127783 | 7/2012 |
| JP | A-2012-199782 | 10/2012 |
| JP | A-2012-230021 | 11/2012 |

* cited by examiner

DETECTION CIRCUIT, SEMICONDUCTOR INTEGRATED CIRCUIT DEVICE, MAGNETIC FIELD ROTATION ANGLE DETECTION DEVICE, AND ELECTRONIC DEVICE

The present application claims a priority based on Japanese Patent Application No. 2013-059601 filed on Mar. 22, 2013, the contents of which are incorporated herein by reference.

BACKGROUND

1. Technical Field

The present invention relates to a detection circuit that is connectable to a magnetic sensor in which magnetoresistance elements (hereinafter also referred to as "MR elements") are used and that detects a rotation angle of a magnetic field, and a semiconductor integrated circuit device. The invention also relates to a magnetic field rotation angle detection device including the magnetic sensor and the detection circuit. The invention further relates to an electronic device or the like, such as a water meter, a gas meter, or a speed meter, in which the magnetic field rotation angle detection device is used.

2. Related Art

MR elements have the property to change the value of their resistance depending on the intensity of a magnetic field because of the magnetoresistance effect. When a magnetic field is applied to an MR element, the value of its resistance increases. Thus, detection of the rotation angle of a rotating body that produces a rotating magnetic field has been performed by bridge-connecting a plurality of MR elements.

As a related technology, JP-A-2007-24738 (paragraphs 0011 to 0020 and FIG. 5) discloses a rotational angle detection device that enables rotational angle detection for rotational angles ranging from 0° to 360° with an extremely simple configuration. This rotational angle detection device includes a rotating magnet attached to a detection object and rotated with the detection object to generate a rotating magnetic field, a magnetic sensor positioned in a rotating magnetic field generated by the rotating magnet to position sensor units with a plurality of bridge-connected MR elements in such a way that their easy-magnetization axes are displaced by an angle of 45% and a four-pole auxiliary magnet positioned in the vicinity of the magnetic sensor to generate a synthesized rotating magnetic field ranging from 0° to 180° from a rotating magnetic field ranging from 0° to 360° provided by the rotating magnet in a region where the magnetic sensor is positioned.

According to JP-A-2007-24738 (paragraphs 0011 to 0020 and FIG. 5), since the four-pale auxiliary magnet is disposed in the vicinity of the magnetic sensor, a synthesized magnetic moment between, a synthesized magnetic moment of the four-pole auxiliary magnet and a magnetic moment obtained from the rotating magnet converts a rotational angle ranging from 0° to 360° provided by the rotating magnet into a rotational angle ranging from 0° to 180°. This enables a detected value for a rotational angle of between 0° and 180° at the magnetic sensor to be obtained as a detected value for a rotational angle between 0° and 360° for the detection object.

Moreover, with regard to a circuit for signal processing, known circuits can be used without change. A plurality of detection signals output from the magnetic sensor are subjected to A/D conversion in a plurality of A/D conversion circuits, respectively, and input to a CPU. The CPU performs predetermined signal processing of those detection signals and calculates rotational angle detection data.

JP-A-2007-24738 (paragraphs 0011 to 0020 and FIG. 5) is an example of related art.

However, use of a four-pole auxiliary magnet in a magnetic field rotation angle detection device significantly increases the component mounting area and the cost. Moreover, use of an A/D conversion circuit in a detection circuit significantly increases the current consumption of the circuit and the cost. Therefore, it has been desired to realize a high resolution without using a four-pole auxiliary magnet and an A/D conversion circuit. In that case, if the rotation angle of a magnetic field is detected using a magnetic sensor in which two sensor units each including a plurality of bridge-connected MR elements are arranged so as to be shifted by 45° from each other, the rotation angle can only be detected with a resolution of 45° (⅛ rotation).

SUMMARY

An advantage of some aspects of the invention is to detect the rotation angle of a magnetic field using a magnetic sensor in which two sensor units each including a plurality of bridge-connected MR elements are arranged at a predetermined angle with respect to each other with a resolution of an angle smaller than 45° (⅛ rotation) with a simple circuit configuration.

A detection circuit according to a first aspect of the invention is a detection circuit that is connectable to a magnetic sensor in which a first sensor unit and a second sensor unit are arranged at a predetermined angle with respect to each other, each sensor unit having a bridge circuit or magnetoresistance elements, the detection circuit including a first comparison circuit that compares output signals of the first or second sensor units, a second comparison circuit that compares an output signal of the first sensor unit with an output signal of the second sensor unit, and a rotation angle calculation circuit that calculates a rotation angle of a magnetic field based, on a comparison result of the first comparison circuit and a comparison result of the second comparison circuit.

According to the first aspect of the invention, in addition to the comparison between the output signals of the first or second sensor unit, the comparison of an output signal of the first sensor unit with an output signal of the second sensor unit is performed. Thus, the rotation angle of the magnetic field can be detected with a resolution of an angle smaller than 45° (⅛ rotation).

A detection circuit according to a second aspect of the invention is the detection circuit according to the first aspect of the invention, wherein the first comparison circuit includes a first comparator that compares two output signals of the first sensor unit and outputs a first detection signal that indicates a comparison result and a second comparator that compares two output signals of the second sensor unit and outputs a second detection signal that indicates a comparison result, the second comparison circuit includes a third comparator that compares one of the two output signals of the first sensor unit with one of the two output signals of the second sensor unit and a fourth comparator that compares the other output signal of the first sensor unit with that output signal of the second sensor unit, and the rotation, angle calculation circuit includes a logic circuit that generates a third detection signal based on a comparison result of the third comparator and a comparison result of the fourth comparator.

According to the second aspect of the invention, in addition to the comparison between the two output signals of each sensor unit, the comparison of one of the two output signals of the first sensor unit with one of the two output signals of the second sensor unit and the comparison of the other output signal of the first sensor unit with that output signal of the second sensor unit are performed. Thus, the rotation angle of the magnetic field can be detected with a resolution of 22.5° (1/16 rotation).

A detection circuit according to a third aspect of the invention is the detection circuit according to the first aspect of the invention, wherein the first comparison circuit includes a first comparator that compares two output signals of the first sensor unit and outputs a first detection signal that indicates a comparison result, and the second comparison circuit includes an amplification unit that amplifies an output signal of the first sensor unit by a predetermined amplification factor and outputs a first amplified signal and a second amplified signal, the amplified signals having the same amplitude and mutually different signs, a second comparator that compares an output signal of the second sensor unit with the first amplified signal and outputs a second detection signal that indicates a comparison result, and a third comparator that compares the output signal of the second sensor unit with the second amplified signal and outputs a third detection signal that indicates a comparison result.

According to the third aspect of the invention, in addition to the comparison between the two output signals of the first sensor unit, an output signal of the first sensor unit is amplified by a predetermined amplification factor to obtain the first amplified signal and the second amplified signal with mutually different signs, and the comparison of an output signal of the second sensor unit with the first amplified signal and the comparison of that output signal of the second sensor unit with the second amplified signal are performed. Thus, the rotation angle of the magnetic field can be detected with a resolution of 30° (1/12 rotation).

A detection circuit according to a fourth aspect is the detection circuit according to the first aspect of the invention, wherein the first comparison circuit includes a first comparator that compares two output signals of the first sensor unit and outputs a first detection signal that indicates a comparison result, and the second comparison circuit includes an amplification unit that amplifies one of the two output signals of the first sensor unit by a predetermined amplification factor and outputs an amplified signal, a second comparator that compares an output signal of the second sensor unit with the amplified signal and outputs a second detection signal that indicates a comparison result, and a third comparator that compares another output signal of the second sensor unit with the amplified signal and outputs a third detection signal that indicates a comparison result.

According to the fourth aspect of the invention, in addition to the comparison, between the two output signals of the first sensor unit, one of the two output signals of the first sensor unit is amplified by the predetermined amplification factor to obtain the amplified signal, and the comparison of one output signal of the second sensor unit with the amplified signal and the comparison of the other output signal of the second sensor unit with the amplified signal are performed. Thus, the rotation angle of the magnetic field, can be detected with a resolution of 30° (1/12 rotation).

Here, the detection circuit according to the third or fourth aspect of the invention may further include a voltage dividing circuit that generates a reference potential for use in the amplification unit by dividing a power supply voltage. In that case, the midpoint potential of the amplified signals can be made close to a desired reference potential.

A semiconductor integrated circuit device according to some aspects of the invention includes any of the foregoing detection circuits. Embedding the detection circuit, which uses no A/D conversion circuits, in the semiconductor integrated circuit device makes it possible to reduce the circuit size and the cost.

A magnetic field rotation angle detection device according to some aspects of the invention includes any of the foregoing detection circuits and the magnetic sensor. Thus, a magnetic field rotation angle detection device capable of detecting the rotation angle of the rotating body with a high resolution can be realized.

An electronic device according to some aspects of the invention includes the above-described magnetic field rotation angle detection device and a rotating body that produces a rotating magnetic field. Thus, a water meter, a gas meter, a speed meter, or the like can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
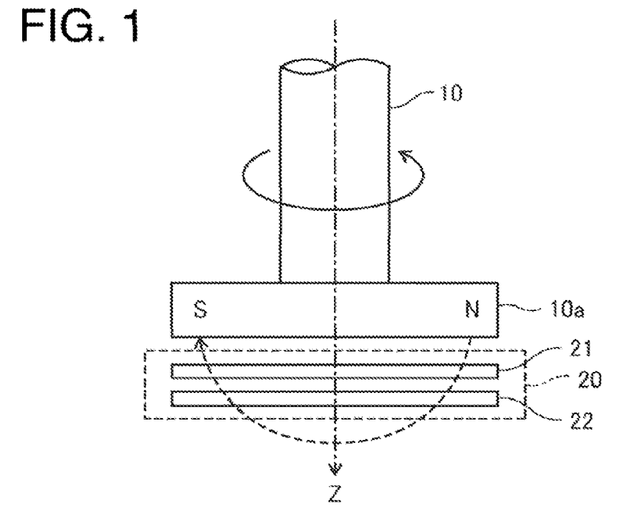
FIG. 1 is a side view showing a portion of the configuration of an electronic device according to some embodiments of the invention.

The following describes embodiments of the invention in detail with reference to the drawings. FIG. 1 is a side view showing a portion of the configuration of an electronic device according to some embodiments of the invention. This electronic device may be an electronic device such as a water meter, a gas meter, or a speed meter and includes a rotating body 10 that has a magnet 10a and a magnetic sensor 20 that has a first sensor unit 21 and a second sensor unit 22.

For example, the rotating body 10 is connected to an impeller or the like that is rotated by movement of a fluid such as tap water or gas. Alternatively, the rotating body 10 may be a rotating shaft of a motor or a wheel. Rotation of the rotating body 10 causes the magnet 10a to produce a rotating magnetic field. The magnetic sensor 20 is disposed in a position through which lines of magnetic flux travelling from the N-pole to the S-pole of the magnet 10a pass.

Each of the first sensor unit 21 and the second sensor unit 22 has a bridge circuit of MR elements. An MR element has the property to change the value of its resistance depending on the intensity of a magnetic field because of the magnetoresistance effect, and the resistance value increases when a magnetic field is applied to the MR element.

Figure 2:
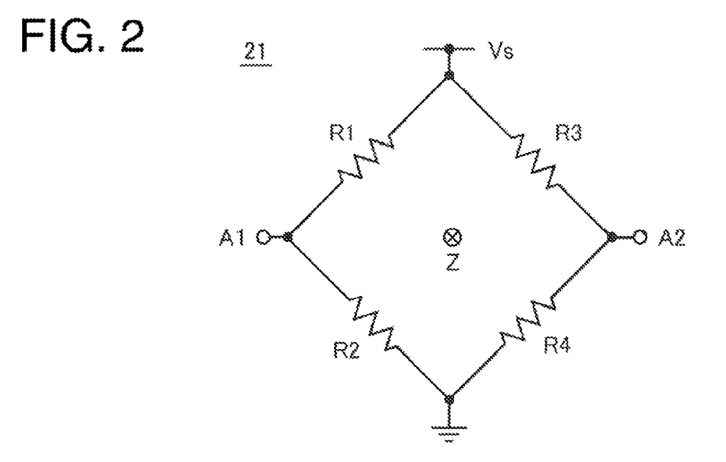
FIG. 2 is a plan view showing the configuration and orientation of a first sensor unit.
Figure 3:
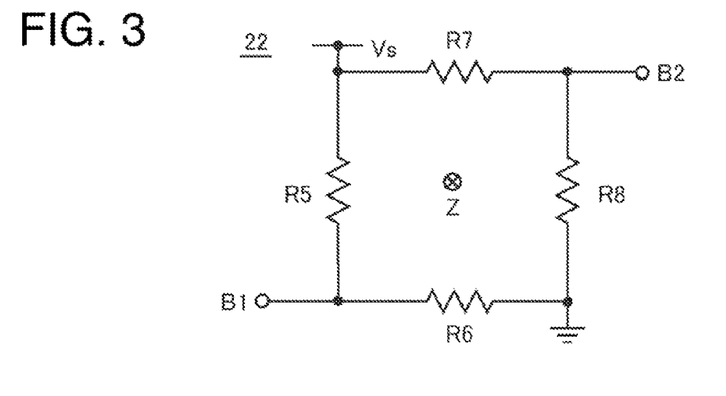
FIG. 3 is a plan view showing the configuration and orientation of a second sensor unit.

FIG. 2 is a plan view showing the configuration and orientation of the first sensor unit 21. The first sensor unit 21 has bridge-connected MR elements R1 to R4. FIG. 3 is a plan view showing the configuration and orientation of the second sensor unit 22. The second sensor unit 22 has bridge-connected MR elements R5 to R8. The first sensor unit 21 and the second sensor unit 22 sure arranged at an angle of approximately 45° with respect to each other in a plane that is substantially orthogonal to a rotation axis Z of the rotating body 10 that produces a rotating magnetic field.

As shown in FIG. 1, the sensor units 21 and 22 may be arranged in two respective planes that are situated at different positions in the direction of the rotation axis Z. In that case, it is desirable that the rotation axis Z is located at substantially the center of the MR elements R1 to R4 as shown in FIG. 2, and the rotation axis Z of the rotating body 10 is also located at substantially the center of the MR elements R5 to R5 as shown in FIG. 3. When the sensor units 21 and 22 are arranged in this manner, the rotation angle of the rotating body 10 can be accurately detected. Alternatively, the sensor units 21 and 22 may be arranged in the same plane. In that case, it is easy to mount the sensor units 21 and 22 on a substrate.

As shown in FIG. 2, a connection point between the MR elements R1 and R3 is connected to a sensor power supply potential $V_S$ on the higher potential side, and a connection point between the MR elements R2 and R4 is connected to a power supply potential (ground potential in this embodiment) on the lower potential side. A connection point between the MR elements R1 and R2 is connected to a first output terminal, and an output signal A1 is output from the first output terminal. A connection point between the MR elements R3 and R4 is connected to a second output terminal, and an output signal A2 is output from the second output terminal.

As shown in FIG. 3, a connection point between the MR elements R5 and R7 is connected to the sensor power supply potential $V_S$ on the higher potential side, and a connection point between the MR elements R6 and R8 is connected to the power supply potential (ground potential in this embodiment) on the lower potential side. A connection point between the MR elements R5 and R6 is connected to a first output terminal, and an output signal B1 is output from the first output terminal. A connection point between the MR elements R7 and R8 is connected to a second output terminal, and an output signal B2 is output from the second output terminal.

Next, detection circuits according to first to third embodiments of the invention will be described. The detection circuits according to the first to third embodiments of the invention are detection circuits that are connectable to a magnetic sensor in which a first sensor unit and a second sensor unit each having a bridge circuit of magnetoresistance elements are arranged at a predetermined angle with respect to each other, and include a first comparison circuit that compares output signals of the first or second sensor unit, a second comparison circuit that compares an output signal of the first sensor unit with an output signal of the second sensor unit, and a rotation angle calculation circuit that calculates the rotation angle of a magnetic field based on the comparison result of the first comparison circuit and the comparison result of the second comparison circuit.

Figure 4:
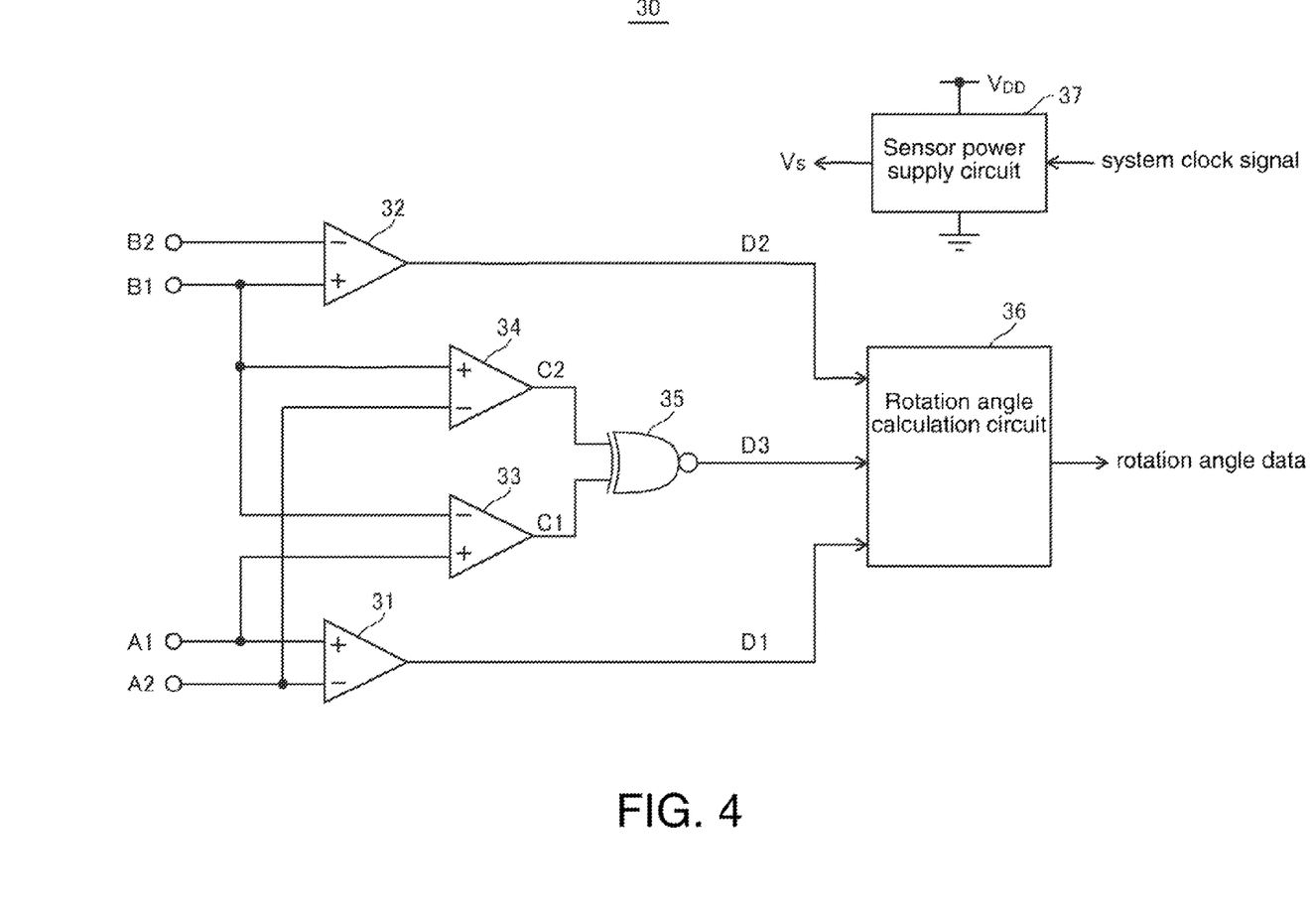
FIG. 4 is a circuit diagram showing the configuration of a detection circuit according to a first embodiment of the invention.

FIG. 4 is a circuit diagram showing the configuration of the detection circuit according to the first embodiment of the invention. This detection circuit is connected to the magnetic sensor shown in FIGS. 1 to 3 and constitutes a magnetic field rotation angle detection device together with the magnetic sensor.

As shown in FIG. 4, a detection circuit 30 includes comparators 31 and 32 that constitute a first comparison circuit, comparators 33 and 34 that constitute a second comparison circuit, a rotation angle calculation circuit 36 that has a logic circuit 35, and a sensor power supply circuit 37. These circuits may be embedded in a semiconductor integrated circuit device.

The comparator 31 compares the two output signals A1 and A2 of the first sensor unit 21 shown in FIG. 2 and outputs a first detection signal D1 that indicates the comparison result. The first detection signal D1 is at a high level when the output signal A1 is greater than the output signal A2, and at a low level when the output signal A1 is smaller than the output signal A2.

The comparator 32 compares the two output signals B1 and B2 of the second sensor unit 22 shown in FIG. 3 and outputs a second detection signal D2 that indicates the comparison result. The second detection signal D2 is at a high level when the output signal B1 is greater than the output signal B2, and at a low level when the output signal B1 is smaller than the output signal B2.

The comparator 33 compares the output signal A1, which is one of the two output signals, of the first sensor unit 21 shown in FIG. 2 with the output signal B1, which is one of the two output signals, of the second sensor unit 22 shown in FIG. 3 and outputs a comparison signal C1 that indicates the comparison result. The comparison signal C1 is at a high level when the output signal A1 is greater than the output signal B1, and at a low level when the output signal A1 is smaller than the output signal B1.

The comparator 34 compares the other output signal A2 of the first sensor unit 21 shown in FIG. 2 with the output signal B1 of the second sensor unit 22 shown in FIG. 3 and outputs a comparison signal C2 that indicates the comparison result. The comparison signal C2 is at a high level when the output signal A2 is smaller than the output signal B1, and at a low level when the output signal A2 is greater than the output signal B1.

The logic circuit 35 generates a third detection signal D3 based on the comparison signal C1, which is output from the comparator 33, and the comparison signal C2, which is output from the comparator 34. For example, the logic circuit 35 is configured by an exclusive-OR circuit with an inverted output (ENOR circuit), and generates the third detection signal D3 by inverting the exclusive-OR of the comparison signal C1 and the comparison signal C2.

Figure 5A:
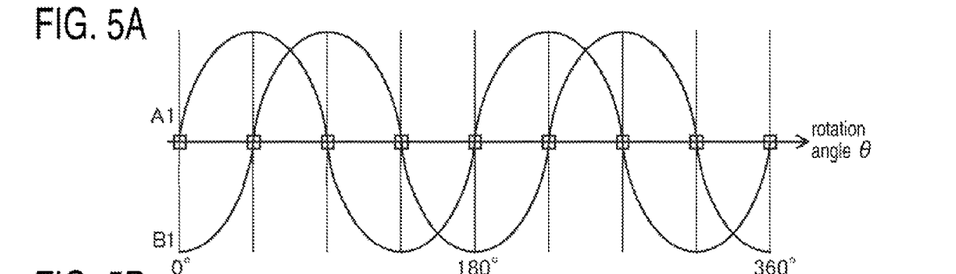
FIGS. 5A to 5C are waveform charts for explaining the operation of the detection circuit according to the first embodiment of the invention.
Figure 5B:
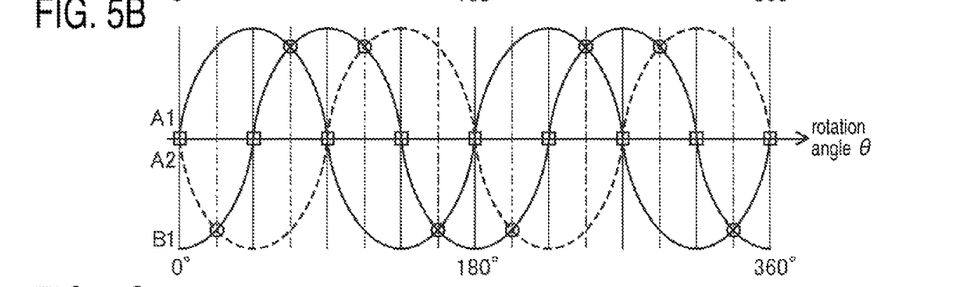
Figure 5C:
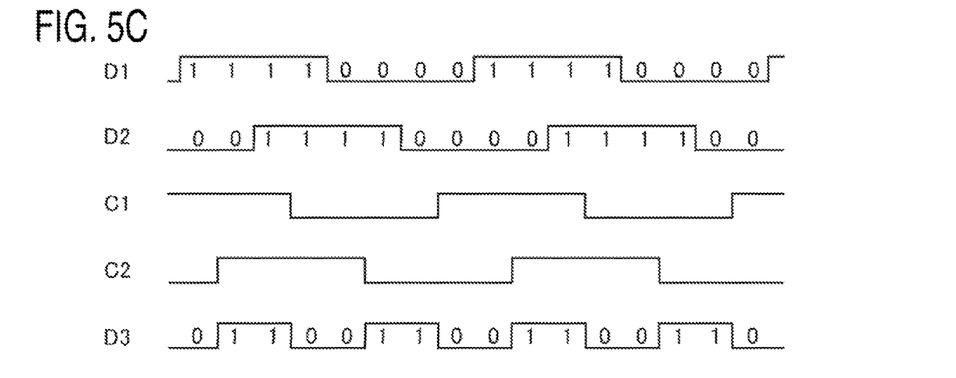

FIGS. 5A to 5C are waveform charts for explaining the operation of the detection circuit according to the first embodiment of the invention. In FIGS. 5A to 5C, the horizontal axis indicates the rotation angle θ of the rotating body. FIG. 5A shows a waveform of phase A (SIN) that is represented by the output signal A1 of the first sensor unit 21 shown in FIG. 2, and a waveform of phase B (COS) that is represented by the output signal B1 of the second sensor unit 22 shown in FIG. 3.

The first detection signal D1 shown in FIG. 5C is obtained by comparing the two output signals A1 and A2 of the first sensor unit 21. Also, the second detection signal D2 shown in FIG. 5C is obtained by comparing the two output signals B1 and B2 of the second sensor unit 22.

FIG. 5B shows a waveform of the other output signal A2 of the first sensor unit 21 by a dashed line, in addition to the waveform of the output signal A1 of the first sensor unit 21 shown in FIG. 2 and the waveform of the output signal B1 of the second sensor unit 22 shown in FIG. 3.

The comparison signal C1 shown in FIG. 5C is obtained by comparing the output signal A1 of the first sensor unit 21 with the output signal B1 of the second sensor unit 22. Also, the comparison signal C2 shown in FIG. 5C is obtained by comparing the other output signal A2 of the first sensor unit 21 with the output signal B1 of the second sensor unit 22. Furthermore, the third detection signal D3 shown in FIG. 5C is generated by inverting the exclusive-OR of the comparison signal C1 and the comparison signal C2.

Figure 6:
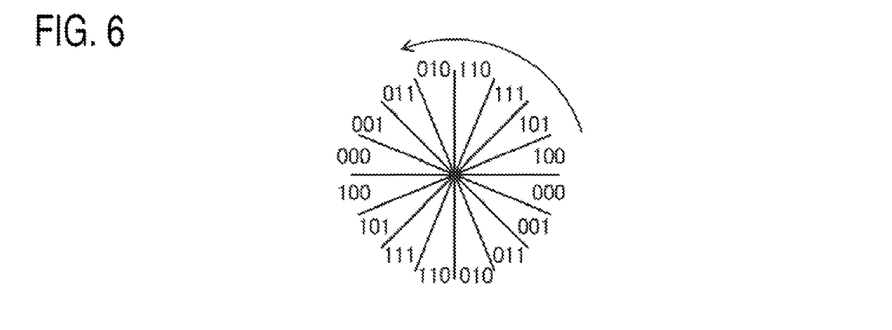
FIG. 6 is a diagram showing rotation angles of a rotating body that are indicated by first to third detection signals.

FIG. 6 is a diagram showing rotation angles of the rotating body that are indicated by the first to third detection signals. As shown in FIG. 6, eight angular ranges within a rotation angle of 180° can be discriminated by 3-bit data constituted by the first to third detection signals D1 to D3. Each angular range is set at 22.5° (1/16 rotation). The rotation angle calculation circuit 36 shown in FIG. 4 calculates rotation angle data that indicates the rotation angles of the rotating body based on the first to third detection signals D1 to D3. The amount of usage of tap water or gas or the speed of a bicycle or the like can be obtained by integrating the rotation angle data over a unit time.

Referring again to FIG. 4, the sensor power supply circuit 37 supplies the sensor power supply potential $V_S$ to an analog circuit including the first sensor unit 21 shown in FIG. 2, the second sensor unit 22 shown in FIG. 3, and the comparators 31 to 34. Here, the sensor power supply circuit 37 may intermittently drive the analog circuit by supplying the sensor power supply potential $V_S$ only for a predetermined period of time in synchronization with a system clock signal. The power that is consumed by the analog circuit can be significantly reduced by making the period of time for which the sensor power supply potential $V_S$ is supplied shorter than a single cycle of the system clock signal.

According to the first embodiment of the invention, in addition to the comparison between the two output signals of each sensor unit, the comparison of the output signal A1 of the first sensor unit 21 with the output signal B1 of the second sensor unit 22 and the comparison of the other output signal A2 of the first sensor unit 21 with the output signal B1 of the second sensor unit 22 are performed. Thus, the rotation angle of the magnetic field can be detected with a resolution of 22.5° (1/16 rotation).

Next, the detection circuit according to the second embodiment of the invention will be described.

Figure 7:
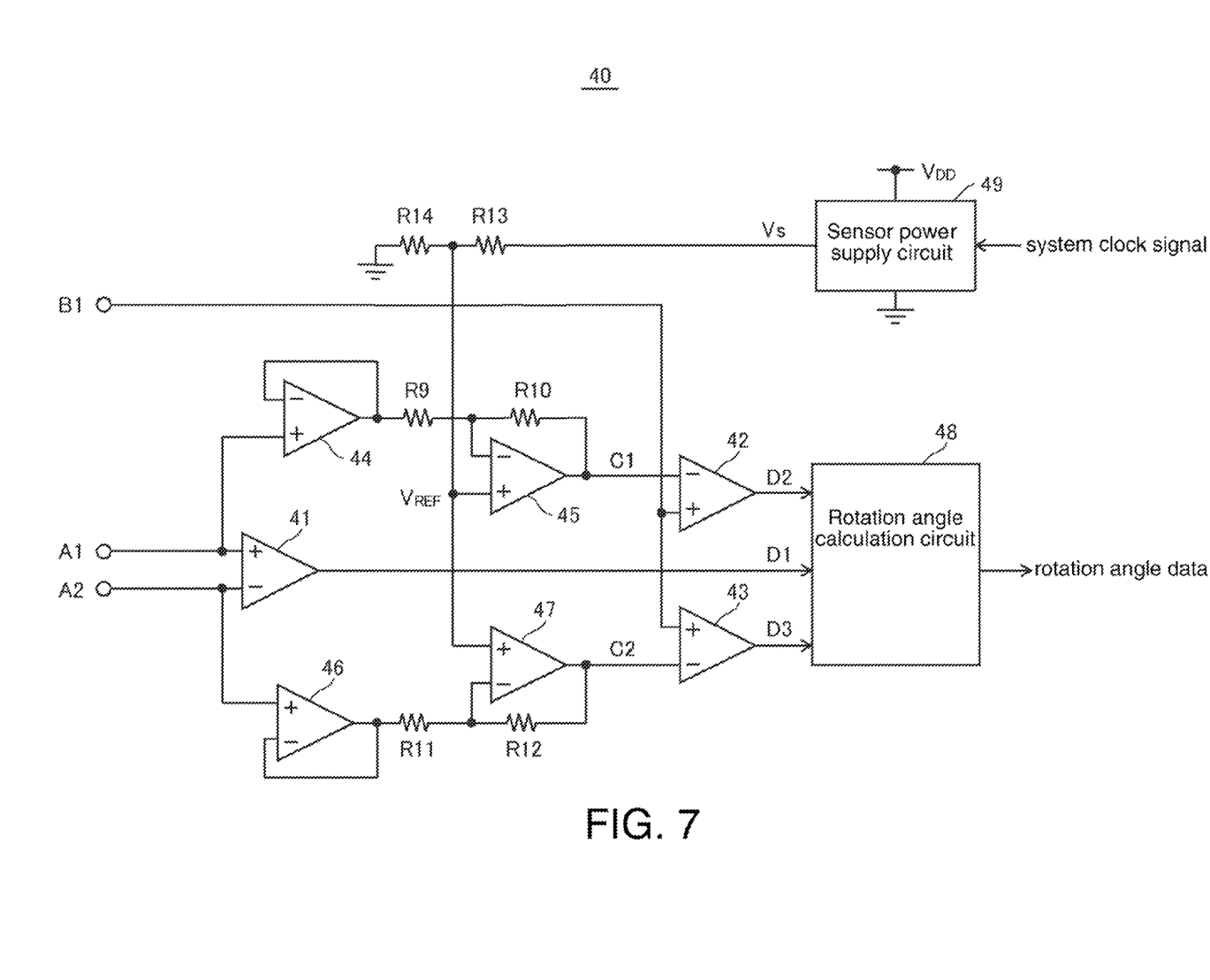
FIG. 7 is a circuit diagram showing the configuration of a detection circuit according to a second embodiment of the invention.

FIG. 7 is a circuit diagram showing the configuration of the detection circuit according to the second embodiment of the invention. This detection circuit is connected to the magnetic sensor shown in FIGS. 1 to 3 and constitutes a magnetic field rotation angle detection device together with the magnetic sensor.

As shown in FIG. 7, a detection circuit 40 includes a comparator 41 that constitutes a first comparison circuit, comparators 42 and 43 that constitute a second comparison circuit, operational amplifiers 44 to 47 and resistors R9 to R14 that constitute an amplification unit of the second comparison circuit, a rotation angle calculation circuit 48, and a sensor power supply circuit 49. These circuits may be embedded in a semiconductor integrated circuit device.

The comparator 41 compares the two output signals A1 and A2 of the first sensor, unit 21 shown in FIG. 2 and outputs a first detection signal D1 that indicates the comparison result. The first detection signal D1 is at a high level when the output signal A1 is greater than the output signal A2, and at a low level when the output signal A1 is smaller than the output signal A2.

The operational amplifiers 44 and 46 work as voltage followers and buffer the two output signals A1 and A2 of the first sensor unit 21 shown in FIG. 2. The operational amplifiers 45 and 47 amplify the respective output signals A1 and A2 from the operational amplifiers 44 and 46 by a predetermined amplification factor and output a first amplified signal C1 and a second amplified signal C2, respectively, that have the same amplitude and mutually different signs. In the case where the operational amplifiers 45 and 47 have sufficiently large open-loop gains, the amplification factor of the operational amplifier 45 is given by −R10/R9, and the amplification factor of the operational amplifier 47 is given by −R12/R11.

Alternatively, the operational amplifiers 44 and 46 may amplify one of the two output signals A1 and A2 of the first sensor unit 21 shown in FIG. 2 in a positive phase and in a negative phase, thereby generating the first amplified signal C1 and the second amplified signal C2 that have the same amplitude and mutually different signs.

The resistors R13 and R14 constitute a voltage dividing circuit that generates a reference potential $V_{REF}$ for use in the operational amplifiers 45 and 47 by dividing a power supply voltage that is determined by the sensor power supply potential $V_S$ on the higher potential side and the power supply potential on the lower potential side. Thus, the midpoint potential of the amplified signals can be made close to a desired reference potential $V_{REF}$. For example, when R1=R2 and R3=R4 in the first sensor unit 21 shown in FIG. 2, and R5=R6 and R7=R8 in the second sensor unit 22 shown in FIG. 3, in the case where no magnetic field is present, it is assumed that R13=R14.

The comparator 42 compares the output signal B1 of the second sensor unit 22 shown in FIG. 3 with the first amplified signal C1 and outputs a second detection signal D2 that indicates the comparison result. The second detection signal D2 is at a high level when the output signal B1 is greater than the amplified signal C1, and at a low level when the output signal B1 is smaller than the amplified signal C1.

The comparator 43 compares the output signal B1 of the second sensor unit 22 with the second amplified signal C2 and outputs a third detection signal D3 that indicates the comparison result. The third detection signal D3 is at a high level when the output signal B1 is greater than the amplified signal C2, and at a low level when the output signal B1 is smaller than the amplified signal C2.

Figure 8A:
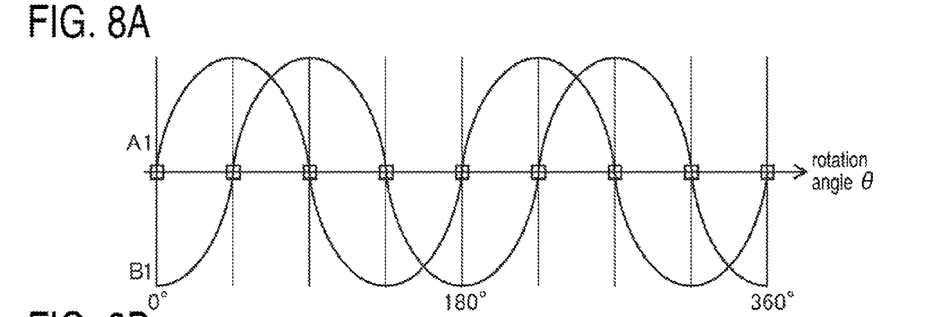
FIGS. 8A to 8C are waveform charts for explaining the operation of the detection circuit according to the second embodiment of the invention.
Figure 8B:
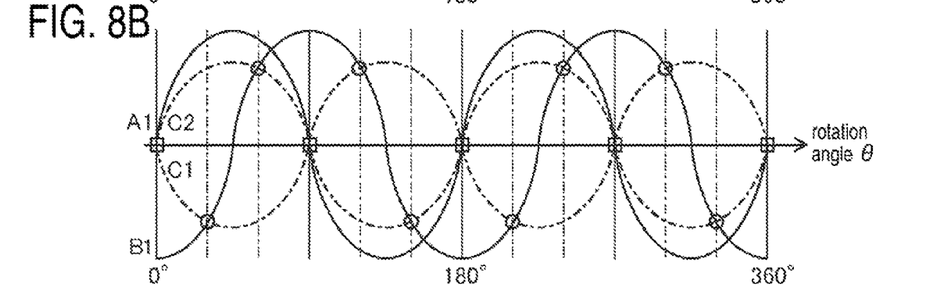
Figure 8C:
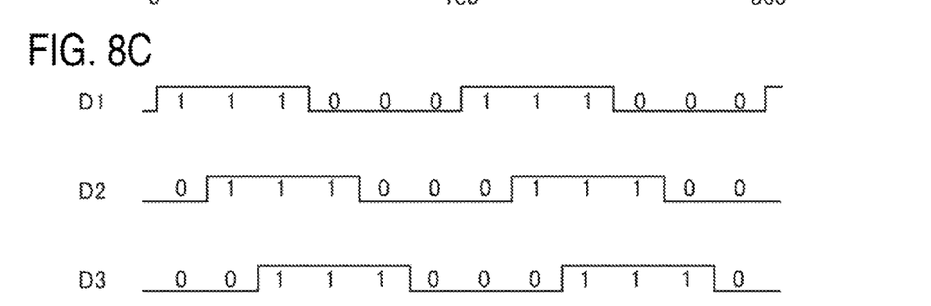

FIGS. 8A to 8C are waveform charts for explaining the operation of the detection circuit according to the second embodiment of the invention. In FIGS. 8A to 8C, the horizontal axis indicates the rotation angle θ of the rotating body. FIG. 8A shows a waveform of phase A (SIN) that is represented by the output signal A1 of the first sensor unit 21 shown in FIG. 2 and a waveform of phase B (COS) that is represented by the output signal B1 of the second sensor unit 22 shown in FIG. 3. A first detection signal D1 shown in FIG. 8C is obtained by comparing the two output signals A1 and A2 of the sensor unit 21.

FIG. 8B shows waveforms of the amplified signals C1 and C2, which are obtained by amplifying the two output signals A1 and A2 of the first sensor unit 21 by a predetermined amplification factor, by long-short dashed lines, in addition to the waveform of phase A (SIN) and the waveform of phase B (COS).

In this embodiment, the potential of the output signal B1 of the second sensor unit 22 shown in FIG. 3 is compared with the potentials of the amplified signals C1 and C2. When the amplitude of the output signal B1 is B, the potential of the output signal B1 is given by the following equation:

$$B1 = -B \cos 2\theta.$$

Also, when the amplitude of the amplified signals C1 and C2 is C, the potentials of the amplified signals C1 and C2 are given by the following equations:

$$C1 = -C \sin 2\theta,$$

$$C2 = C \sin 2\theta.$$

In order to detect the rotation angle of the rotating body with a resolution of 30° (1/12 rotation), the amplification factor of the operational amplifier 45 shown in FIG. 7 is set so that the potential of the output signal B1 and the potential of the amplified signal C1 are equal to each other when the rotation angle θ of the rotating body is 30°:

$$-B \cos 60° = -C \sin 60°.$$

Hence, $$B/C = \sin 60°/\cos 60° = \tan 60° = 3^{1/2}.$$

Hence, $$C = 3^{-1/2} B.$$

Therefore, the amplification factor of the operational amplifier 45 is $-3^{-1/2}$ (about −0.6).

Moreover, the amplification factor of the operational amplifier 47 shown in FIG. 7 is set so that the potential of the output signal B1 and the potential of the amplified signal C2 are equal to each other when the rotation angle θ of the rotating body is 60°:

$$-B \cos 120° = C \sin 120°.$$

Hence, $$B/C = -\sin 120°/\cos 120° = -\tan 120° = 3^{1/2}.$$

Hence, $$C = 3^{-1/2} B.$$

Therefore, the amplification factor of the operational amplifier 47 is $-3^{-1/2}$ (about −0.6).

A second detection signal D2 shown in FIG. 8C is generated by comparing the output signal B1 of the second sensor unit 22 with the first amplified signal C1. Also, a third detection signal D3 shown in FIG. 3C is generated by comparing the output signal B1 of the second sensor unit 22 with the second amplified signal C2.

Figure 9:
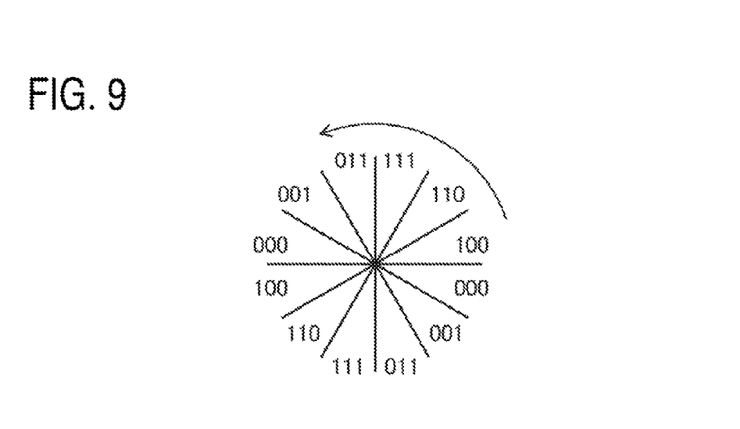
FIG. 9 is a diagram showing rotation angles of the rotating body that are indicated, by first to third detection signals.

FIG. 9 is a diagram showing rotation angles of the rotating body that are indicated by the first to third detection signals. As shown in FIG. 9, six angular ranges within 180° can be discriminated by 3-bit data constituted by the first to third detection signals D1 to D3. Each angular range is set at 30° (1/12 rotation). Based on the first to third detection signals D1 to D3, the rotation angle calculation circuit 48 shown in FIG. 7 calculates rotation angle data that indicates the rotation angles of the rotating body. It is possible to obtain the amount of usage of tap water or gas or the speed of a bicycle or the like by integrating the rotation angle data over a unit time.

Referring again to FIG. 7, the sensor power supply circuit 49 supplies the sensor power supply potential $V_S$ to an analog circuit including the first sensor unit 21 shown in FIG. 2, the second sensor unit 22 shown in FIG. 3, the comparators 41 to 43, and the operational amplifiers 44 to 47. Here, the sensor power supply circuit 49 may intermittently drive the analog circuit by supplying the sensor power supply potential $V_S$ to the analog circuit for a predetermined period of time in synchronization with the system clock signal. The power that is consumed by the analog circuit can be significantly reduced by making the period of time for which the sensor power supply potential $V_S$ is supplied shorter than a single cycle of the system clock signal.

According to the second embodiment of the invention, in addition to the comparison between the two output signals A1 and A2 of the first sensor unit 21, the output signal A1 and the output signal A2 of the first sensor unit 21 is amplified by a predetermined amplification factor to obtain the first amplified signal C1 and the second amplified signal C2 with mutually different signs, and the comparison of the output signal B1 or B2 of the second sensor unit 22 with the first amplified signal C1 and the comparison of the output signal B1 or B2 of the second sensor unit 22 with the second amplified signal C2 are performed. Thus, the rotation angle of the magnetic field can be detected with a resolution of 30° (1/12 rotation).

Next, the detection circuit according to the third embodiment of the invention will be described.

Figure 10:
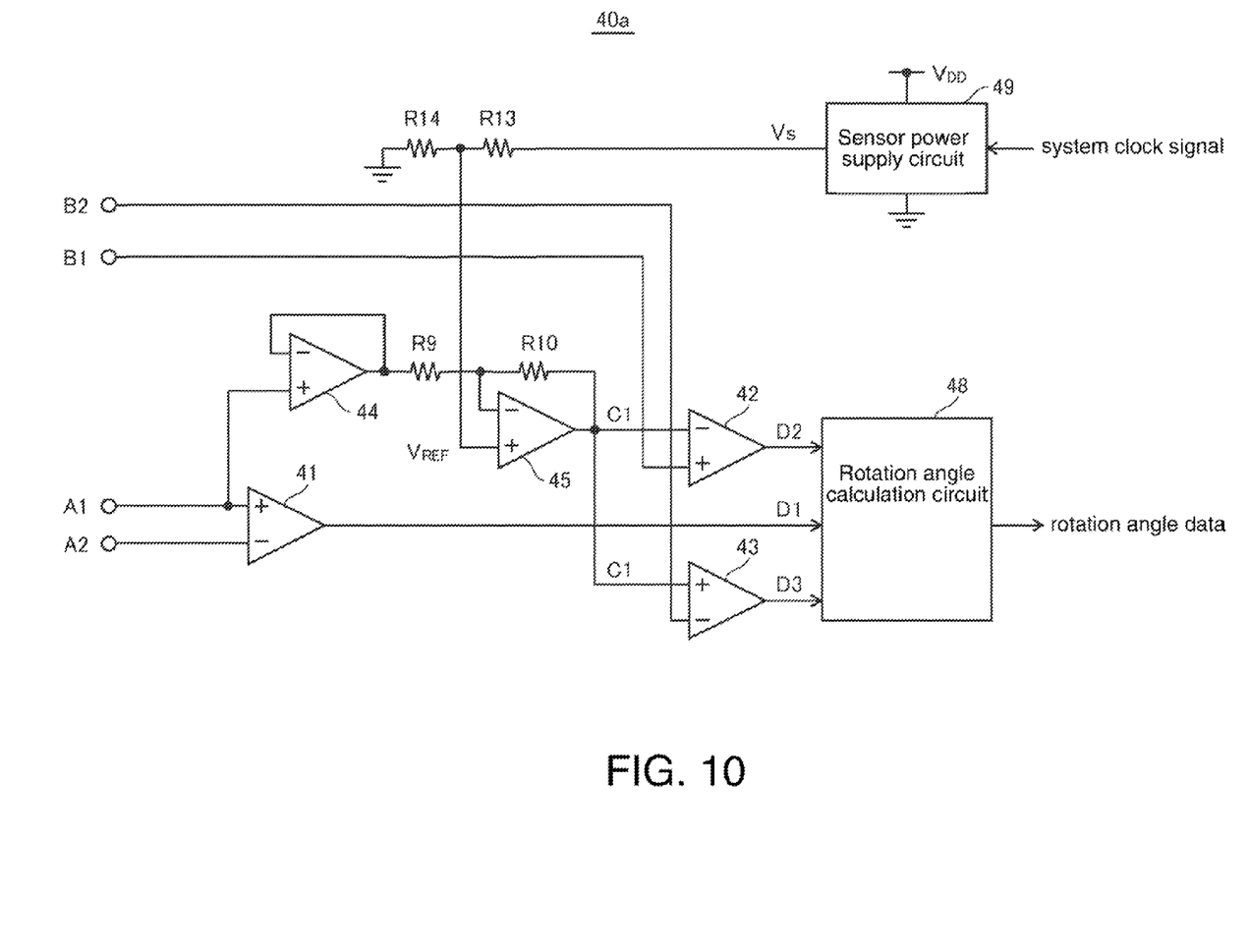
FIG. 10 is a circuit diagram showing the configuration of a detection circuit according to a third embodiment of the invention.

FIG. 10 is a circuit diagram showing the configuration of the detection circuit according to the third embodiment of the invention. This detection circuit is a variation of the detection circuit according to the second embodiment of the invention, and a duplicate description of like constitutional elements will be omitted.

As shown in FIG. 10, a detection circuit 40a includes the comparator 41 that constitutes the first comparison circuit, the comparators 42 and 43 that constitute the second comparison circuit, and the operational amplifiers 44 and 45 and the resistors R9, R10, R13, and R14 that constitute the amplification unit of the second comparison circuit. These circuits may be embedded in a semiconductor integrated circuit device.

The operational amplifier 44 works as a voltage follower and buffers the output signal A1 of the first sensor unit 21 shown in FIG. 2. The operational amplifier 45 amplifies the output signal A1 from the operational amplifier 44 by a predetermined amplification factor and outputs an amplified signal C1.

The comparator 42 compares the output signal B1 of the second sensor unit 22 shown in FIG. 3 with the amplified signal C1 and outputs a second detection signal D2 that indicates the comparison result. The second detection signal D2 is at a high level when the output signal B1 is greater than the amplified signal C1, and at a low level when the output signal B1 is smaller than the amplified signal C1.

The comparator 43 compares the other output signal B2 of the sensor unit 22 with the amplified signal C1 and outputs a third detection signal D3 that indicates the comparison result. The third detection signal D3 is at a high level when the output signal B2 is smaller than the amplified signal C1, and at a low level when the output signal B2 is greater than the amplified signal C1.

Figure 11A:
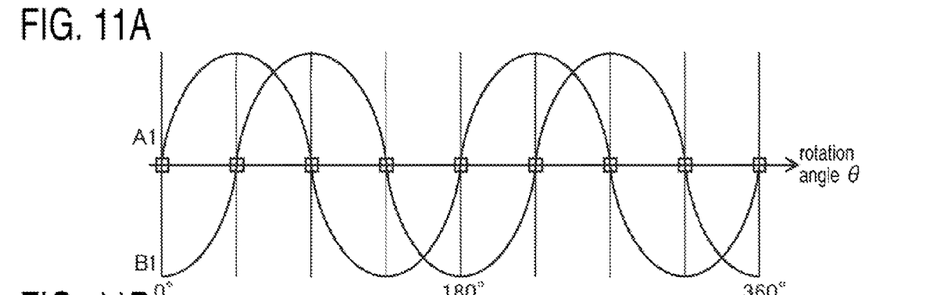
FIGS. 11A to 11C are waveform charts for explaining the operation of the detection circuit according to the third embodiment of the invention.
Figure 11B:
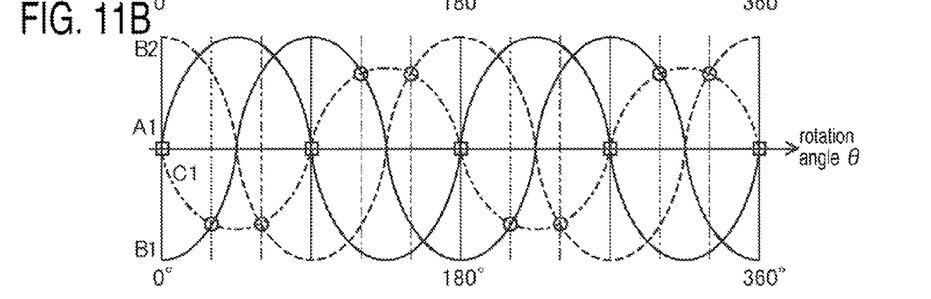
Figure 11C:
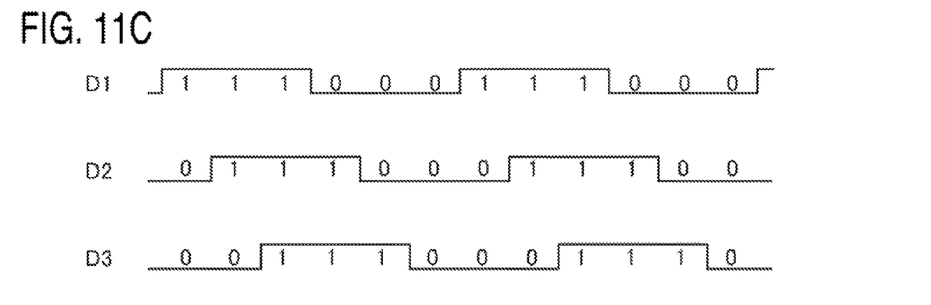

FIGS. 11A to 11C are waveform charts for explaining the operation of the detection circuit according to the third embodiment of the invention. In FIGS. 11A to 11C, the horizontal axis indicates the rotation angle θ of the rotating body. FIG. 11A shows a waveform of phase A (SIN) that is represented by the output signal A1 of the first sensor unit 21 shown in FIG. 2 and a waveform of phase B (COS) that is represented by the output signal B1 of the second sensor unit 22 shown in FIG. 3. A first detection signal D1 shown in FIG. 11C is obtained by comparing the two output signals A1 and A2 of the sensor unit 21.

FIG. 11B shows a waveform of the other output signal B2 of the second sensor unit 22 by a dashed line and a waveform of the amplified signal C1, which is obtained by amplifying the output signal A1 of the first sensor unit 21 by the predetermined amplification factor, by a long-short dashed line, in addition to the waveform of phase A (SIN) and the waveform of phase B (COS).

In this embodiment, the potentials of the two output signals B1 and B2 of the second sensor unit 22 shown in FIG. 3 are compared with the potential of the amplified signal C1. When the amplitude of the output signals B1 and B2 is B, the potentials of the output signals B1 and B2 are given by the following equations:

$$B1 = -B\cos 2\theta,$$

$$B2 = B\cos 2\theta.$$

Also, when the amplitude of the amplified signal C1 is C, the potential of the amplified signal C1 is given by the following equation:

$$C1 = -C\sin 2\theta.$$

In order to detect the rotation angle of the rotating body with a resolution of 30° (1/12 rotation), the amplification factor of the operational amplifier 45 shown in FIG. 10 is set so that the potential of the output signal B1 and the potential of the amplified signal C1 are equal to each other when the rotation angle θ of the rotating body is 30°:

$$-B\cos 60° = -C\sin 60°.$$

Hence, $$B/C = \sin 60°/\cos 60° = \tan 60° = 3^{1/2}.$$

Hence, $$C = 3^{-1/2}B.$$

Therefore, the amplification factor of the operational amplifier 45 is $-3^{-1/2}$ (about −0.6).

Moreover, the amplification factor of the operational amplifier 45 shown in FIG. 10 is set so that the potential of the output signal B2 and the potential of the amplified signal C1 are equal to each other when the rotation angle θ of the rotating body is 60°:

$$B\cos 120° = -C\sin 120°.$$

Hence, $$B/C = -\sin 120°/\cos 120° = -\tan 120° = 3^{1/2}.$$

Hence, $$C = 3^{-1/2}B.$$

Therefore, the amplification factor of the operational amplifier 45 is $-3^{-1/2}$ (about −0.6) and agrees with the above-described amplification factor.

A second detection signal D2 shown in FIG. 11C is generated by comparing the output signal B1 of the second sensor unit 22 with the amplified signal C1. A third detection signal D3 shown in FIG. 11C is generated by comparing the other output signal B2 of the second sensor unit 22 with the amplified signal C1. The rotation angles of the rotating body that are indicated by the first to third detection signals are the same as those shown in FIG. 9.

According to the third embodiment of the invention, in addition to the comparison between the two output signals A1 and A2 of the first sensor unit 21, the amplified signal C1 is obtained by amplifying the output signal A1 of the first sensor unit 21 by the predetermined amplification factor, and the comparison of the output signal B1 of the second sensor unit 22 with the amplified signal C1 and the comparison of the other output signal B2 of the second sensor unit 22 with the amplified signal C1 are performed. Thus, the rotation angle of the magnetic field can foe detected with a resolution of 30° (1/12 rotation).

The invention is not limited to the embodiments that has been described above, and it will be understood by those skilled in the art that many variations may foe made without departing from the technical idea of the invention.

What is claimed is:

1. A detection circuit that is connectable to a magnetic sensor in which a first sensor unit and a second sensor unit are arranged at a predetermined angle with respect to each other, each sensor unit having a bridge circuit of magnetoresistance elements, the detection circuit comprising:
    a first comparison circuit including:
        a first comparator that compares a first output signal of the first sensor unit with a second output signal of the first sensor unit and outputs a first detection signal that indicates a first comparison result; and
        a second comparator that compares a first output signal of the second sensor unit with a second output signal of the second sensor unit and outputs a second detection signal that indicates a second comparison result;
    a second comparison circuit including:
        a third comparator that compares the first output signal of the first sensor unit with the first output signal of the second sensor unit; and
        a fourth comparator that compares the second output signal of the first sensor unit with the first output signal of the second sensor unit; and
    a rotation angle calculation circuit that calculates a rotation angle of a magnetic field based on one of the comparison results of the first comparison circuit and a comparison result of the second comparison circuit, the rotation angle calculation circuit including a logic circuit that generates a third detection signal based on a comparison result of the third comparator and a comparison result of the fourth comparator.

2. A semiconductor integrated circuit device comprising the detection circuit according to claim 1.

3. A magnetic field rotation angle detection device comprising:
    the detection circuit according to claim 1; and
    the magnetic sensor.

4. A detection circuit that is connectable to a magnetic sensor in which a first sensor unit and a second sensor unit are arranged at a predetermined angle with respect to each other, each sensor unit having a bridge circuit of magnetoresistance elements, the detection circuit comprising:
    a first comparison circuit including a first comparator that compares two output signals of the first sensor unit and outputs a first detection signal that indicates a first comparison result;
    a second comparison circuit including:
        an amplification unit that amplifies an output signal of the first sensor unit by a predetermined amplification factor and outputs a first amplified signal and a second amplified signal, the amplified signals having the same amplitude and mutually different signs;
        a second comparator that compares an output signal of the second sensor unit with the first amplified signal and outputs a second detection signal that indicates a second comparison result; and
        a third comparator that compares the output signal of the second sensor unit with the second amplified signal and outputs a third detection signal that indicates a third comparison result; and a rotation angle calculation circuit that calculates a rotation angle of a magnetic field based on the comparison result of the first comparison circuit and one of the comparison results of the second comparison circuit.

5. The detection circuit according to claim 4, further comprising:
   a voltage dividing circuit that generates a reference potential for use in the amplification unit by dividing a power supply voltage.

6. A semiconductor integrated circuit device comprising the detection circuit according to claim 5.

7. A magnetic field rotation angle detection device comprising:
   the detection circuit according to claim 5; and
   the magnetic sensor.

8. A semiconductor integrated circuit device comprising the detection circuit according to claim 4.

9. A magnetic field rotation angle detection device comprising:
   the detection circuit according to claim 4; and
   the magnetic sensor.

10. A detection circuit that is connectable to a magnetic sensor in which a first sensor unit and a second sensor unit are arranged at a predetermined angle with respect to each other, each sensor unit having a bridge circuit of magnetoresistance elements, the detection circuit comprising:
   a first comparison circuit including a first comparator that compares two output signals of the first sensor unit and outputs a first detection signal that indicates a first comparison result;
   a second comparison circuit including:
      an amplification unit that amplifies one of the two output signals of the first sensor unit by a predetermined amplification factor and outputs an amplified signal;
      a second comparator that compares a first output signal of the second sensor unit with the amplified signal and outputs a second detection signal that indicates a second comparison result; and
      a third comparator that compares a second output signal of the second sensor unit with the amplified signal and outputs a third detection signal that indicates a third comparison result; and
   a rotation angle calculation circuit that calculates a rotation angle of a magnetic field based on the comparison result of the first comparison circuit and one of the comparison results of the second comparison circuit.

11. The detection circuit according to claim 10, further comprising:
   a voltage dividing circuit that generates a reference potential for use in the amplification unit by dividing a power supply voltage.

12. A semiconductor integrated circuit device comprising the detection circuit according to claim 11.

13. A magnetic field rotation angle detection device comprising:
   the detection circuit according to claim 11; and
   the magnetic sensor.

14. A semiconductor integrated circuit device comprising the detection circuit according to claim 10.

15. A magnetic field rotation angle detection device comprising:
   the detection circuit according to claim 10; and
   the magnetic sensor.

* * * * *